(12) United States Patent
Contet et al.

(10) Patent No.: US 9,997,693 B2
(45) Date of Patent: Jun. 12, 2018

(54) ENERGY RECOVERING ASSEMBLY AND A METHOD OF PROVIDING THE SAME

(71) Applicant: TITANX ENGINE COOLING HOLDING AB, Sölvesborg (SE)

(72) Inventors: Arnaud Contet, Sölvesborg (SE); Olof Erlandsson, Bräkne-Hoby (SE); Thomas Skåre, Tingsryd (SE)

(73) Assignee: TITANX HOLDING AB (SE)

( * ) Notice: Subject to any disclaimer, the term of this patent is extended or adjusted under 35 U.S.C. 154(b) by 0 days. days.

(21) Appl. No.: 15/536,472

(22) PCT Filed: Dec. 4, 2015

(86) PCT No.: PCT/EP2015/078714
§ 371 (c)(1),
(2) Date: Jun. 15, 2017

(87) PCT Pub. No.: WO2016/096488
PCT Pub. Date: Jun. 23, 2016

(65) Prior Publication Data
US 2017/0365763 A1    Dec. 21, 2017

(30) Foreign Application Priority Data
Dec. 16, 2014    (SE) ...................................... 1451547

(51) Int. Cl.
*H01L 35/30*    (2006.01)
*F01N 5/02*    (2006.01)
(Continued)

(52) U.S. Cl.
CPC .............. *H01L 35/30* (2013.01); *F01N 5/025* (2013.01); *F01N 2240/02* (2013.01); *F28D 21/0003* (2013.01); *H01L 35/32* (2013.01)

(58) Field of Classification Search
CPC ......... H01L 35/00; H01L 35/02; H01L 35/04; H01L 35/06
See application file for complete search history.

(56) References Cited

U.S. PATENT DOCUMENTS 3,197,343 A * 7/1965 Palmatier ................ H01L 35/06
136/212
3,270,513 A * 9/1966 Ter Bush ................ F25B 21/02
62/3.64

(Continued)

FOREIGN PATENT DOCUMENTS

AT          506 262 A2     5/2011
DE          1539324 A1    11/1969

(Continued)

*Primary Examiner* — Christina Chern
(74) *Attorney, Agent, or Firm* — Condo Roccia Koptiw LLP

(57) ABSTRACT

The invention relates to an energy recovering assembly (1) and a method of providing the same for extraction of electric power. The assembly comprises a first array (2) of tubes (6) and a second array (3) of tubes (13). The tubes (6) of the first array (2) are interdigitated with the tubes (13) of the second array (3), such that two tubes (13) of the second array (3) are arranged between two successive tubes (6) of the first array (2), or such that two tubes (6) of the first array (2) are arranged between two successive tubes (13) of the second array (3). Thermo electric modules (4) are received in gaps (7) between adjacent tubes (6, 13) of the first (2) and second arrays (3). Fixation arrangements (5) are received in interspaces (X) between two tubes (6; 13). The fixation arrangements (5) are operable between a first state in which the fixation arrangement (5) is insertable in the associated interspace (X), and a second state in which the fixation arrangement (5) is adapted to exert a pressure on the two tubes (6; 13) in the associated interspace (X), forcing each of the two tubes (6; 13) towards the thermo electric modules (Continued)

(4) and towards the successive tubes (6; 13) adjacent the thermoelectric modules (4).

8 Claims, 15 Drawing Sheets

(51) Int. Cl.
*F28D 21/00* (2006.01)
*H01L 35/32* (2006.01)

(56) References Cited

U.S. PATENT DOCUMENTS

| | | |
|---|---|---|
| 3,377,206 A | 4/1968 | Hanlein et al. |
| 3,531,330 A | 9/1970 | Elfving |
| 4,038,831 A | 8/1977 | Gaudel et al. |
| 2005/0172993 A1 | 8/2005 | Shimoji et al. |
| 2005/0194034 A1 | 9/2005 | Yamaguchi et al. |
| 2009/0020682 A1 | 1/2009 | Penet et al. |
| 2011/0271994 A1 | 11/2011 | Gilley |
| 2017/0018825 A1 | 1/2017 | Grunwald, et al. |

FOREIGN PATENT DOCUMENTS

| | | |
|---|---|---|
| DE | 10 2005 005077 A1 | 9/2005 |
| DE | 10 2007 063196 A1 | 7/2009 |
| DE | 10 2012 222635 A1 | 6/2014 |
| FR | 2 702 829 A1 | 9/1994 |
| JP | 2007 149841 A | 6/2007 |
| JP | 5718285 B2 | 5/2015 |

\* cited by examiner

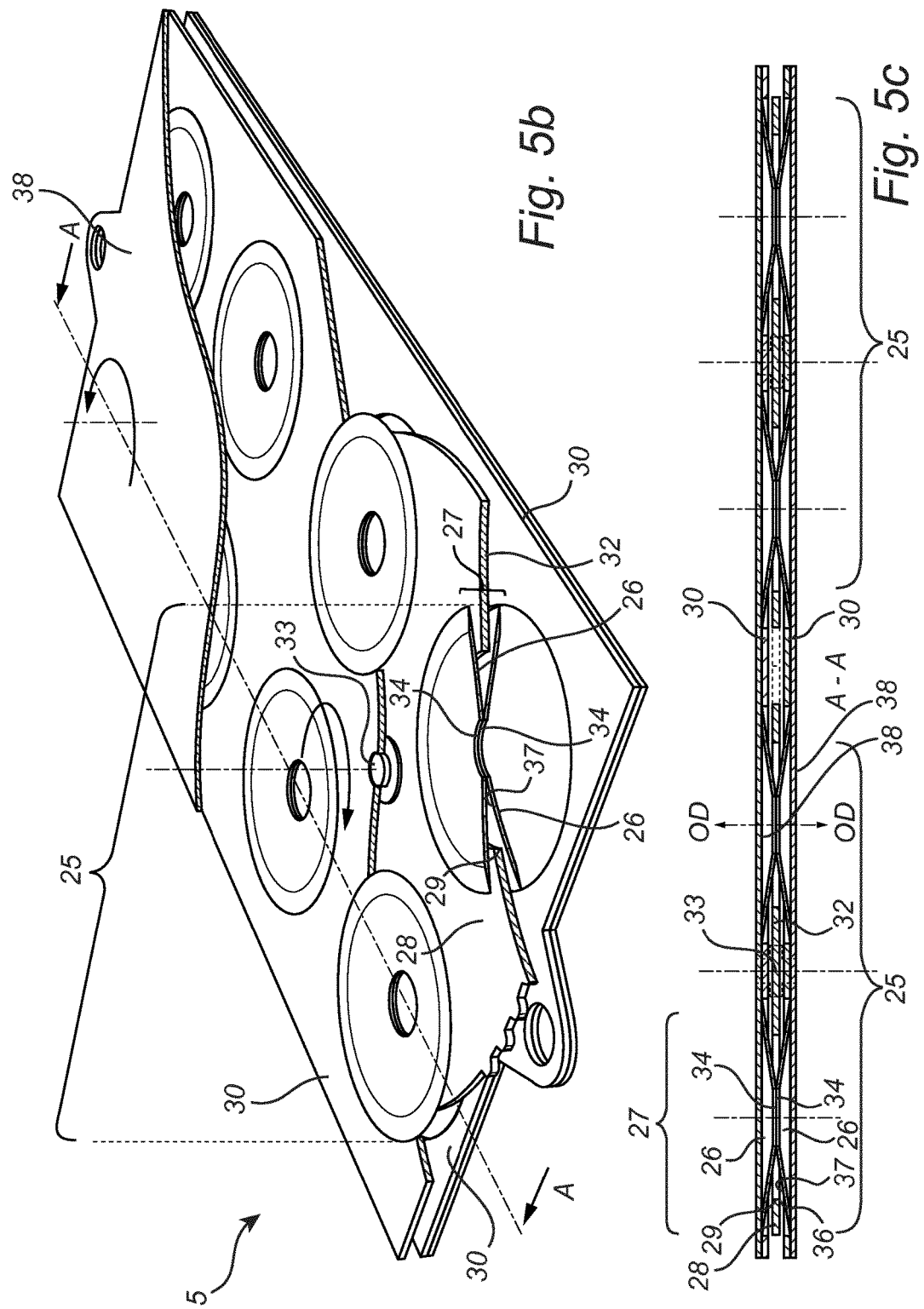

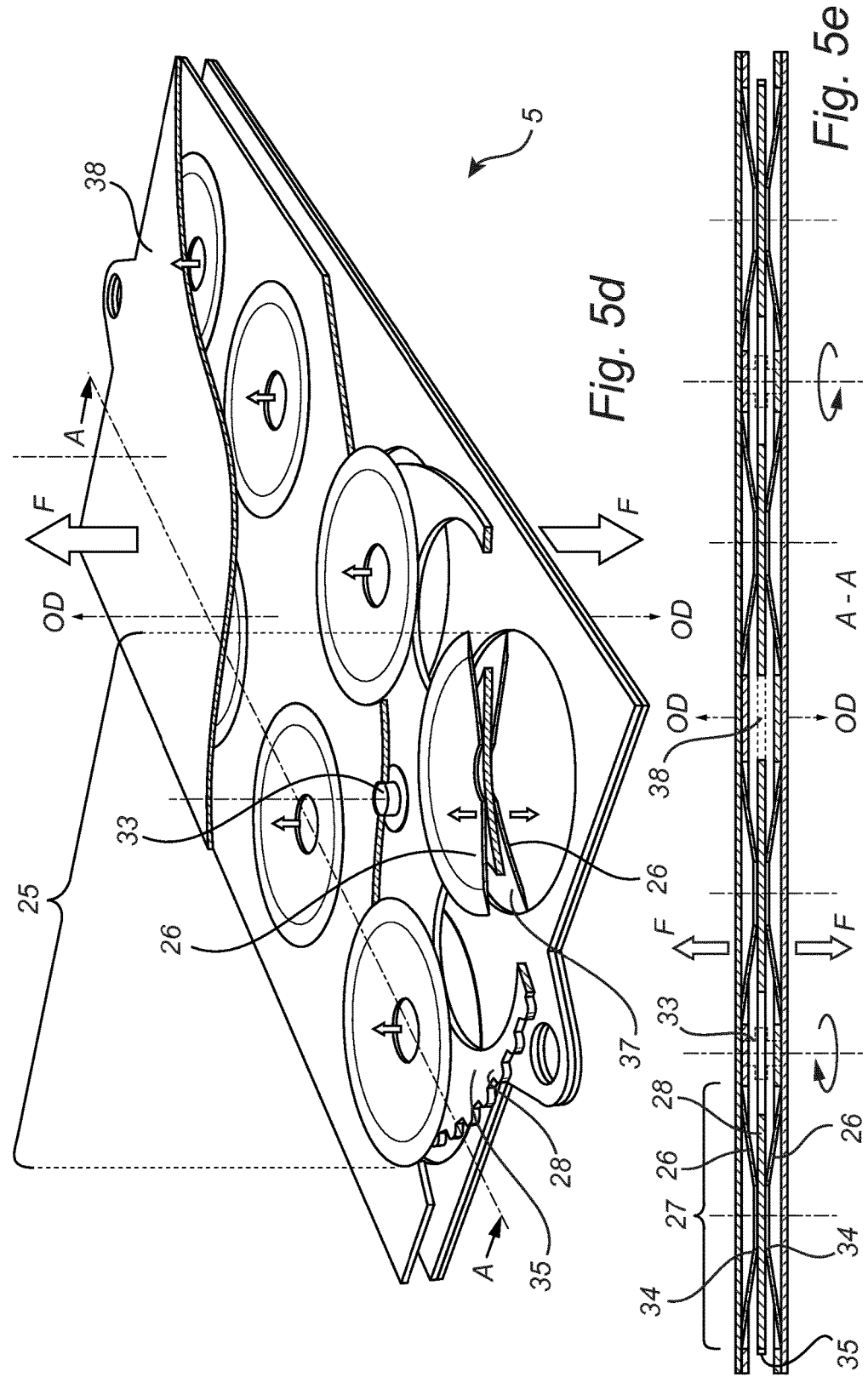

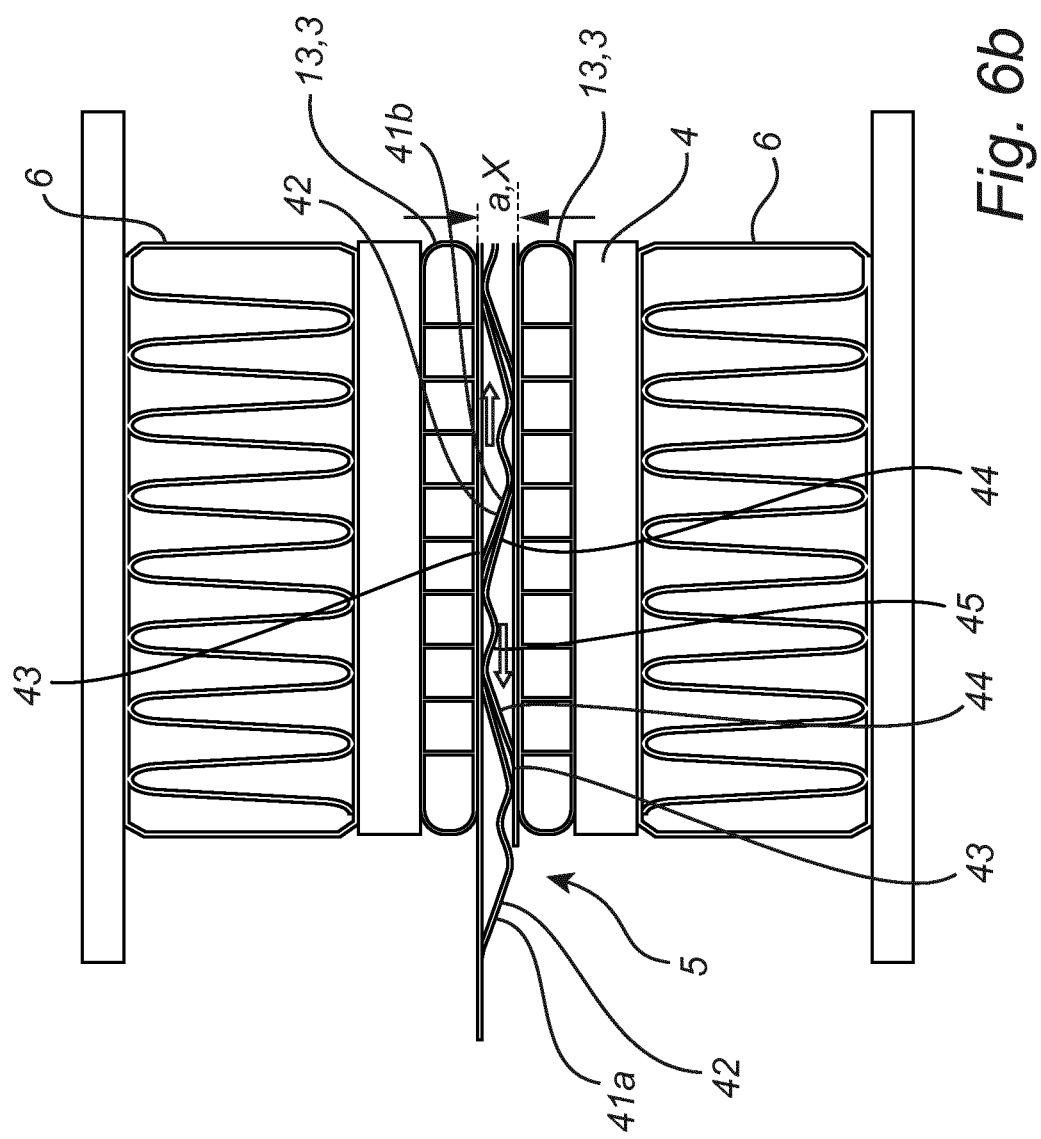

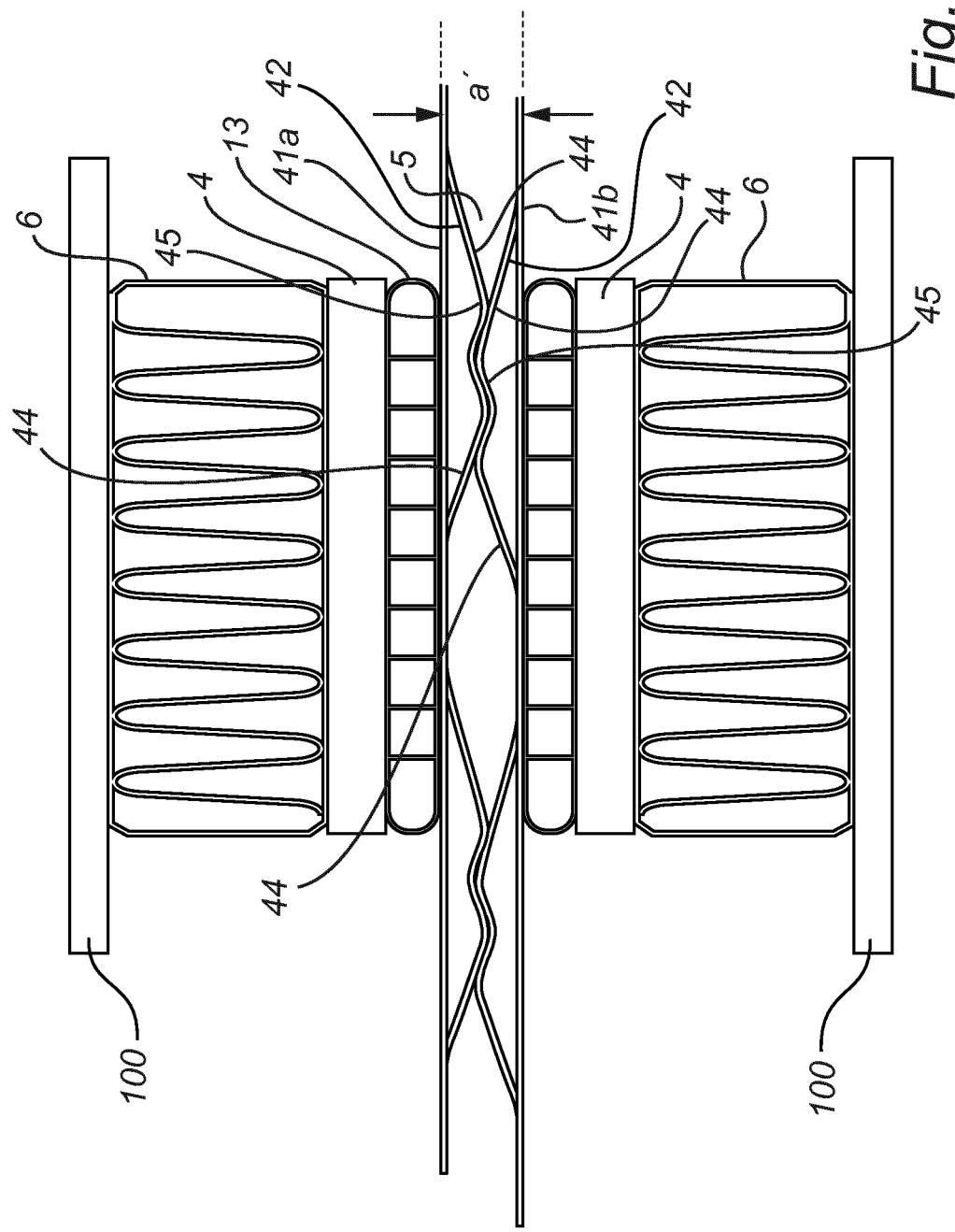

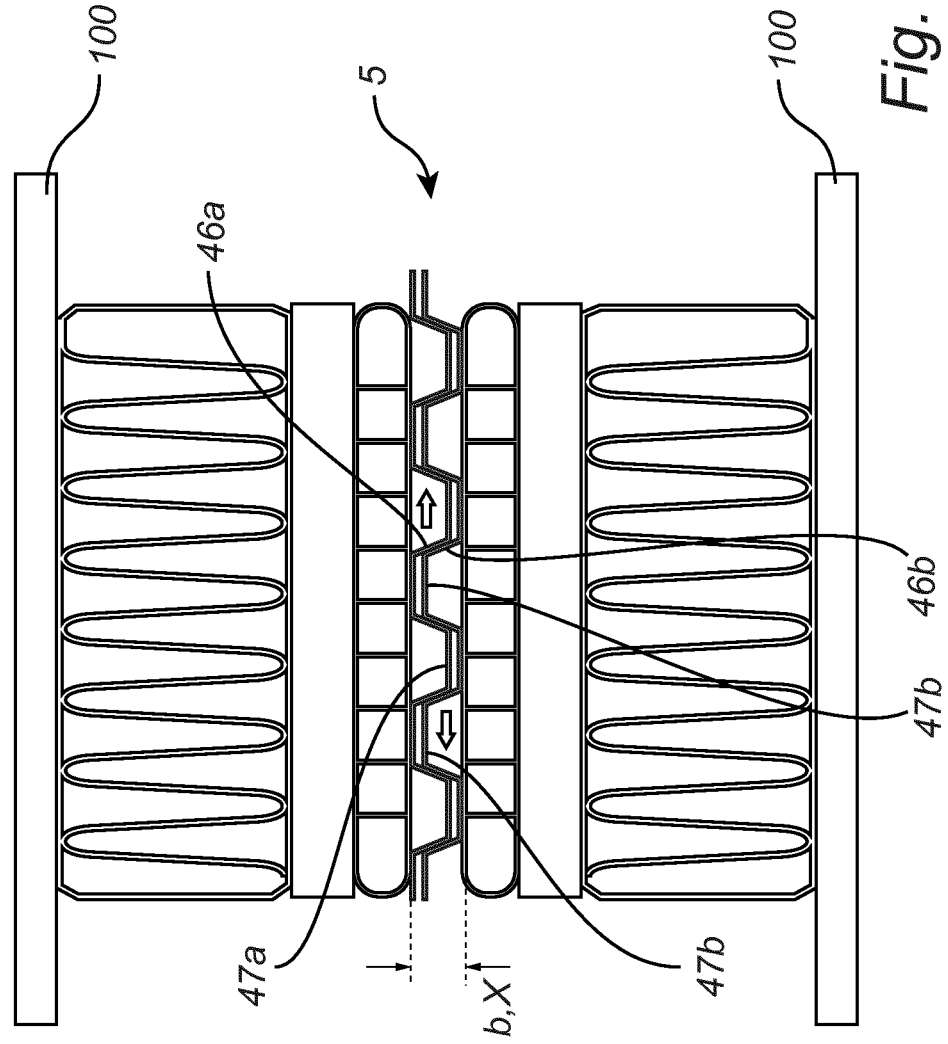

ENERGY RECOVERING ASSEMBLY AND A METHOD OF PROVIDING THE SAME

CROSS REFERENCE TO RELATED APPLICATIONS

This application is the National Stage Entry under 35 U.S.C. § 371 of Patent Cooperation Treaty Application No. PCT/EP2015/078714, filed 4 Dec. 2015, which claims the benefit of Sweden Application No. 1451547-2, filed 16 Dec. 2014, the disclosures of which are incorporated herein by references in their entirety.

TECHNICAL FIELD

The present invention relates to an energy recovering assembly for extraction of electric power and a method of providing such energy recovering assembly.

TECHNICAL BACKGROUND

It is well known to use thermoelectric modules for various cooling devices, e.g. portable refrigeration boxes and for active cooling of integrated circuits like processors. It is also well known to use thermoelectric modules for power generation. If designed and sized properly, exhaust gas- or recycled exhaust gas (EGR) driven thermoelectric modules used as generators may reduce the fuel consumption and hence the $CO_2$-emissions from combustion engine powered machinery and vehicles.

A thermo electric generator system powered by hot exhaust gases consists of inlet and outlet connections to the exhaust gas or EGR streams, a first and a second heat exchanger surface and a thermo electric module arranged between and in contact with the first and the second heat exchanger surfaces. The first heat exchanger surface provides heat transfer from the hot exhaust gas. The second heat exchanger surface is typically connected to an external cooling system.

The thermoelectric module contains at least one thermoelectric element that through a temperature difference between its surfaces convert heat into electrical energy. The generated electrical energy may be handled by power electronics and distributed to power consumers around the combustion engine system, or the machinery that is powered by the combustion engine. Accordingly, the heat energy that normally is expelled through the exhaust gases into the ambient air may be recovered to some degree.

Common for these thermoelectric modules is that they require adequate surface contact with the first and second heat exchanger surfaces. In practice this may be done by applying an axial force or pressure on the core of heat exchanger plates, in which core thermoelectric modules are arranged intermediate the heat exchanger plates. The axial force or pressure may be applied by applying the force from the outside on two opposing rigid end plates, see e.g. DE102007063196A1. Yet another example disclosing a radial compression is disclosed in DE102005005077A1. It is also known to apply an axial pressure within the core. This is by way of example disclosed in AT506262A2, in which a cold tube forming one layer in the core is compressed during assembling of the core, thereby exerting an axial force pressing the thermoelectric modules towards the adjacent warm tubes.

There are several problems to overcome in the design of this kind of assemblies. The performance normally increases with higher temperature differences over the surfaces of the thermoelectric module, meaning that the heat flow through the heat exchanger should be as effective as possible, while at the same time the heat transfer through the thermoelectric module should be as low as possible to maintain the temperature difference.

The contact surface and the contact pressure between the thermoelectric module and the heat exchanger surfaces are important factors to provide a good heat transfer. Therefore, the thermoelectric module is designed by the supplier thereof with a dimensioning contact pressure to provide an optimal operation.

A poor contact or a gap between the thermoelectric module and the hot side of the heat exchanger plate will cause the hot side of the thermoelectric module to be colder, whereby the temperature difference over the thermoelectric module will decrease and hence also electrical performance.

Vice verse, a poor contact between the thermoelectric module and the cold side of the heat exchanger surface will cause the cold side of the thermoelectric module to be hotter, whereby the temperature difference over the thermoelectric module will decrease and hence also electrical performance. In this case there is also a risk that that the thermoelectric module becomes overheated depending on the temperature of the hot fluid.

It is also important that the pressure is uniform across the surface of the thermoelectric module.

SUMMARY OF THE INVENTION

It is an object of the invention to provide an arrangement and a method providing an improved contact pressure and contact surface between the thermoelectric module and the heat exchanger surfaces to thereby ensure a good thermal contact and thereby a good electrical performance.

Yet another object is that the arrangement and method should allow application of the pressure to a plurality of tubes throughout the assembly at one and the same time.

These and other objects are solved by an energy recovering assembly for extraction of electric power, comprising a first array of tubes each adapted to receive a flow of a hot fluid between a first inlet manifold and a first outlet manifold, and a second array of tubes, each adapted to receive a flow of a cold fluid between a first inlet manifold and a second outlet manifold, wherein the tubes of the first array are interdigitated with the tubes of the second array, such that two tubes from the second array are arranged between two successive tubes of the first array, or such that two tubes from the first array are arranged between two successive tubes of the second array, and wherein the energy recovering assembly further comprises thermo electric modules being received in sub-interspaces between adjacent tubes of the first and second arrays, and fixation arrangements being received in interspaces between said two tubes of the second array being arranged between two successive tubes of the first array, or in the interspaces between said two tubes of the first array being arranged between two successive tubes of the second array, whereby each fixation arrangement is operable between a first state allowing the fixation arrangement to be inserted in the associated interspace, and a second state in which the fixation arrangement is adapted to exert a pressure on the two tubes in the associated interspace, forcing said two tubes of the second array arranged between the successive tubes of the first array, or said two tubes of the first array arranged between the successive tubes of the second array, towards the respective thermo electric modules and towards the successive tubes adjacent the respective thermoelectric modules, providing a contact between the thermo electric modules and the adjacent tubes of the first and second arrays.

The invention uses a fixation arrangement that by one single operation may apply a predetermined and uniform pressure to all thermo electric modules. Thereby it may be ensured that the thermo electric modules may work under conditions in line with the dimensioning contact pressure and pressure distribution to thereby provide an optimal operation.

The invention allows a simple assembling during manufacturing since the first and the second array of tubes each may be provided as two single units fully sealed. In fact a complete sealing may be provided during brazing or bonding of the arrays. Thereby there is in principle no need to handle the tubes as individual items in the form of a plurality of individual tubes to be stacked with intermediate loose gaskets etc. This also applies to the thermo electric modules and the fixation arrangements. These may be provided as standalone units ready to be inserted in associated interspaces between the interdigitated tubes. It is even possible to mount at least the thermoelectric modules to the tubes of one of the arrays before interdigitating the tubes of the first and the second arrays. Accordingly, the assembling may be made very handy and time efficient.

By the fixation arrangement there is also no need to use any bulky exterior fixation device which requires a specific tensioning and which has exterior parts susceptible to contamination of oil and dirt during use and which are difficult to access for cleaning.

The tubes of the first and second arrays may each have a flat cross section delimited by at least two opposing wall portions, and wherein the fixation arrangement is arranged to exert a pressure on the two tubes in the first or second array in a direction perpendicular to the surface extension of the opposing wall portions. By the flat cross section a proper contact surface between adjacent items is provided for, no matter if such item is an adjacent tube, a thermoelectric module or a fixation arrangement.

The fixation arrangement may comprise at least one pressure means and a spacer, the spacer being movable in a plane in parallel with the surface extension of the two opposing wall portions to a position over or under the pressure means, thereby operating the fixation arrangement between the first state and the second state.

The pressure means may in the first state be partly received in a through hole in the spacer. The through hole provides a proper positioning of the pressure means during assembly of the fixation arrangement.

The spacer may be arranged between two opposing pressure means, and the two opposing pressure means may be partly received in one and the same through hole of the spacer.

The spacer may be operated by being pushed, pulled or rotated to a position over, under or past the pressure means. Accordingly, the spacer is adapted to be operated in a direction perpendicular to the operation direction of the pressure means.

The at least one pressure means may be a disc spring or a cup spring. These are also known as Belleville springs. Although it is to be understood that other pressure means may be used, a disc spring or a cup spring are favorable in that they inherently exhibit an external inclined wall portion allowing them to cooperate with the spacer while pushing, pulling or rotating the same. Thus a wedging action is facilitated, allowing the spacer to be displaced in a plane essentially perpendicular to the operation direction of the pressure means to a position over or under the pressure means, thereby compressing the same.

The spacer and the at least one pressure means may be arranged between two opposing wall portions, whereby the fixation arrangement constitutes one integral unit. The opposing wall portions will act as pressure distributors adapted to be arranged in direct or indirect contact with the tubes of the first or second arrays.

The second state may be a stable state. By stable is meant that the fixation arrangement will remain in this position unless the fixation arrangement is not actively set anew to said first state. This may by way of example be provided by a locking mechanism safeguarding that the fixation arrangement will not go back to the first state because of vibrations or movements which may occur during vehicle operation.

According to another aspect, the invention relates to a method of providing an energy recovering assembly. The method comprises the steps of providing a first array of tubes, each adapted to receive a flow of hot fluid between a first inlet manifold and a first outlet manifold, the first array of tubes being provided as an integral brazed unit, providing a second array of tubes, each adapted to receive a flow of a cold fluid between a second inlet manifold and a second outlet manifold, the second array of tubes being provided as an integral brazed unit, interdigitating the tubes of the first array with the tubes of the second array, such that two tubes of the second array are arranged between two successive tubes of the first array, or such that two tubes of the second array are arranged between two successive tubes of the first array, arranging thermo electric modules in gaps between adjacent tubes of the first and second arrays, and inserting a fixation arrangement in an interspace between said two tubes of the second array being arranged between two successive tubes of the first array, or in an interspace between said two tubes of the first array being arranged between two successive tubes of the second array, and operating the fixation arrangement from a first state allowing the fixation arrangement to be inserted into said interspace to a second state in which the fixation arrangement exerts a pressure on the two tubes in the associated interspace, forcing said two tubes of the second array arranged between the successive tubes of the first array, or the two tubes of the first array arranged between the successive tubes of the second array towards the respective thermo electric modules and towards the successive tubes adjacent the respective thermoelectric modules, thereby providing a contact between the thermo electric modules and the adjacent tubes of the first and second arrays.

According to yet another aspect, the invention relates to use of an energy recovering assembly comprising the features given above in a combustion engine for extraction of electric power, wherein the hot fluid is exhaust gases from the combustion engine and wherein the cold fluid is a coolant.

BRIEF DESCRIPTION OF THE DRAWINGS

The invention will be described in detail with reference to the schematic drawings.

FIGS. 5a-5e schematically disclose a first embodiment of the fixation arrangement set to the first and the second state respectively.

FIGS. 6a-6c disclose highly schematically a second embodiment of the fixation arrangement.

FIGS. 7a-7c discloses highly schematically a third embodiment of a fixation arrangement.

DETAILED DESCRIPTION

Figure 1:
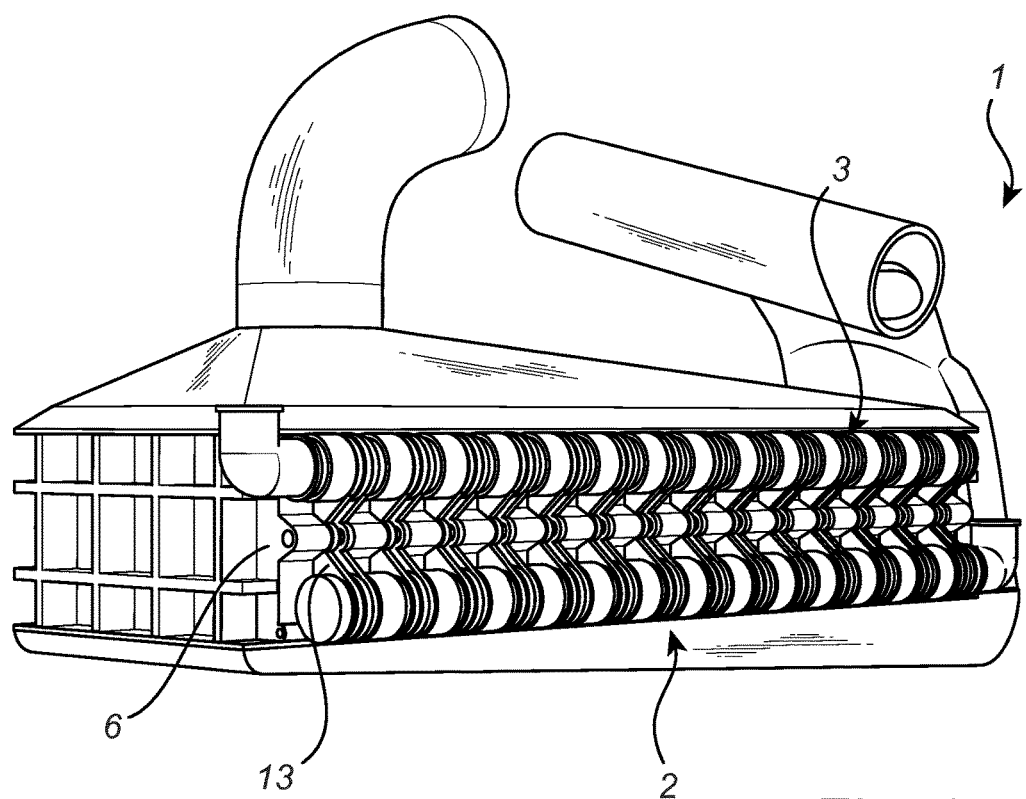
FIG. 1 discloses schematically one example of an energy recovering assembly for extraction of electric power from exhaust gases from a combustion engine.

Now turning to FIG. 1 one example of an energy recovering assembly 1 exemplified for extraction of electric power from exhaust gases from a combustion engine is disclosed. The assembly 1 as such may also be referred to as a thermo electric generator (TEG). The assembly 1 comprises a first array 2 of tubes 6 and a second array 3 of tubes 13. The tubes 6, 13 of the first and second arrays 2, 3 are interdigitated with each other. The assembly 1 further comprises thermo electric modules and fixation arrangements which are received in interspaces between the interdigitated tubes 6, 13. For illustrative purposes, the thermo electric modules and the fixation arrangements are not disclosed in FIG. 1 since they are not visible in the assembled state.

In the description to follow, the assembly 1 will be exemplified as being used in a combustion engine, whereby the hot fluid is constituted by hot exhaust gases or recycled hot exhaust gases (EGR) and wherein the cold fluid is the coolant of a cooling system. It is however to be understood that the assembly is equally applicable in other applications involving a flow of a hot fluid and a cold fluid.

Figure 2:
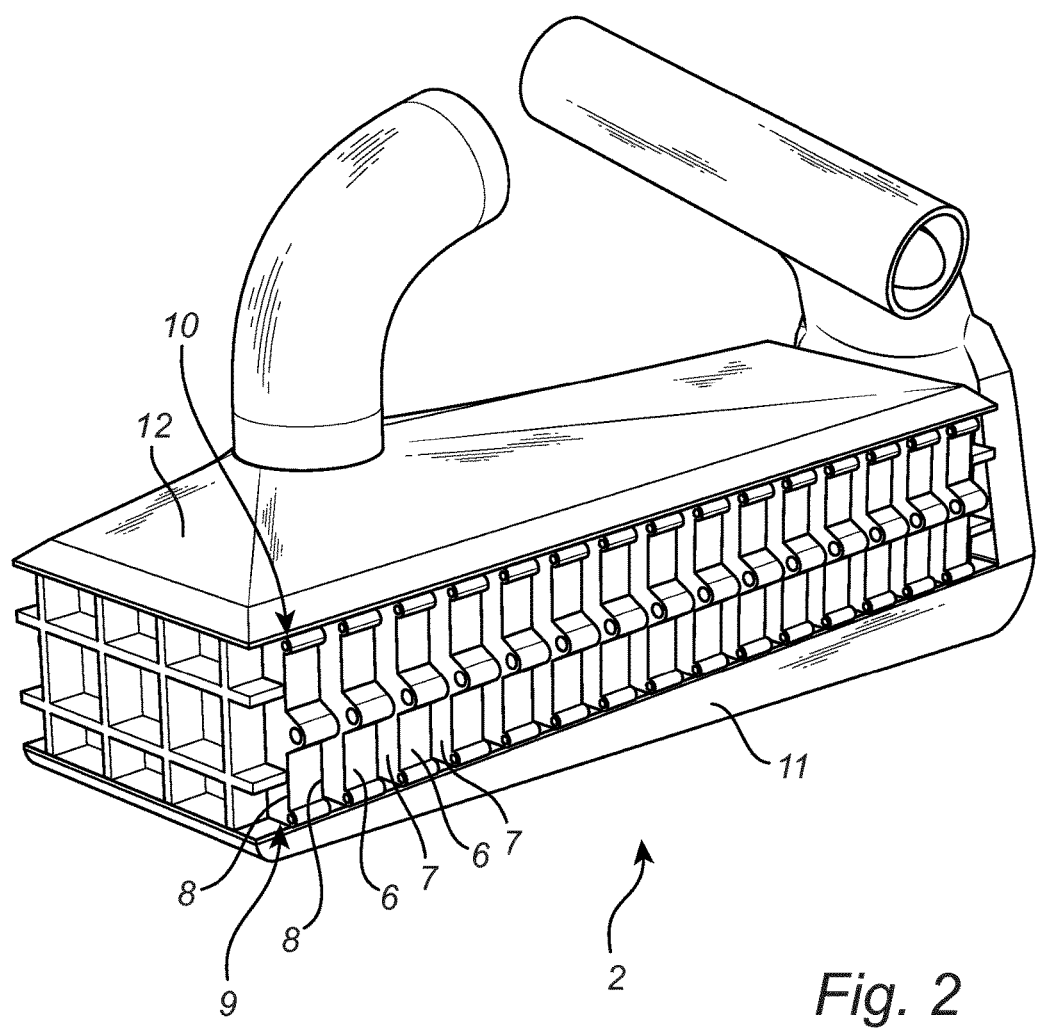
FIG. 2 discloses one embodiment of the first array of tubes.

Now turning to FIG. 2, the first array 2 of tubes 6 will be discussed. The first array 2 comprises a plurality of flat tubes 6 which are arranged side by side with intermediate gaps 7. In the disclosed embodiment, each tube 6 is constituted by two, essentially flat parallel wall portions 8 which are joined along two opposite edge portions to thereby delimit the essentially flat tube 6 having a through channel (not shown) with an inlet opening 9 and an opposite outlet opening 10. The tubes 6 are arranged with their major surfaces essentially in parallel with each other. The tubes 6 may be provided with internal turbulators (not shown). The tubes 6 may be joined to each other by e.g. brazing, welding or bonding to form one integral and fluid tight unit.

The inlet openings 9 are arranged in communication with a first inlet manifold 11. Further, the outlet openings 10 are arranged in communication with a first outlet manifold 12. The first inlet and outlet manifolds 11, 12 are connected to a combustion engine (not shown) to thereby guide a flow of hot exhaust gases or recycled exhaust gas (EGR) from the inlet manifold 11, via the individual tubes 6 towards the first outlet manifold 12. It goes without saying that the design of the first inlet and outlet manifolds 11, 12 respectively should be adapted to the available space in e.g. the engine house, whereby the design thereof may be different than the one illustrated.

Figure 3:
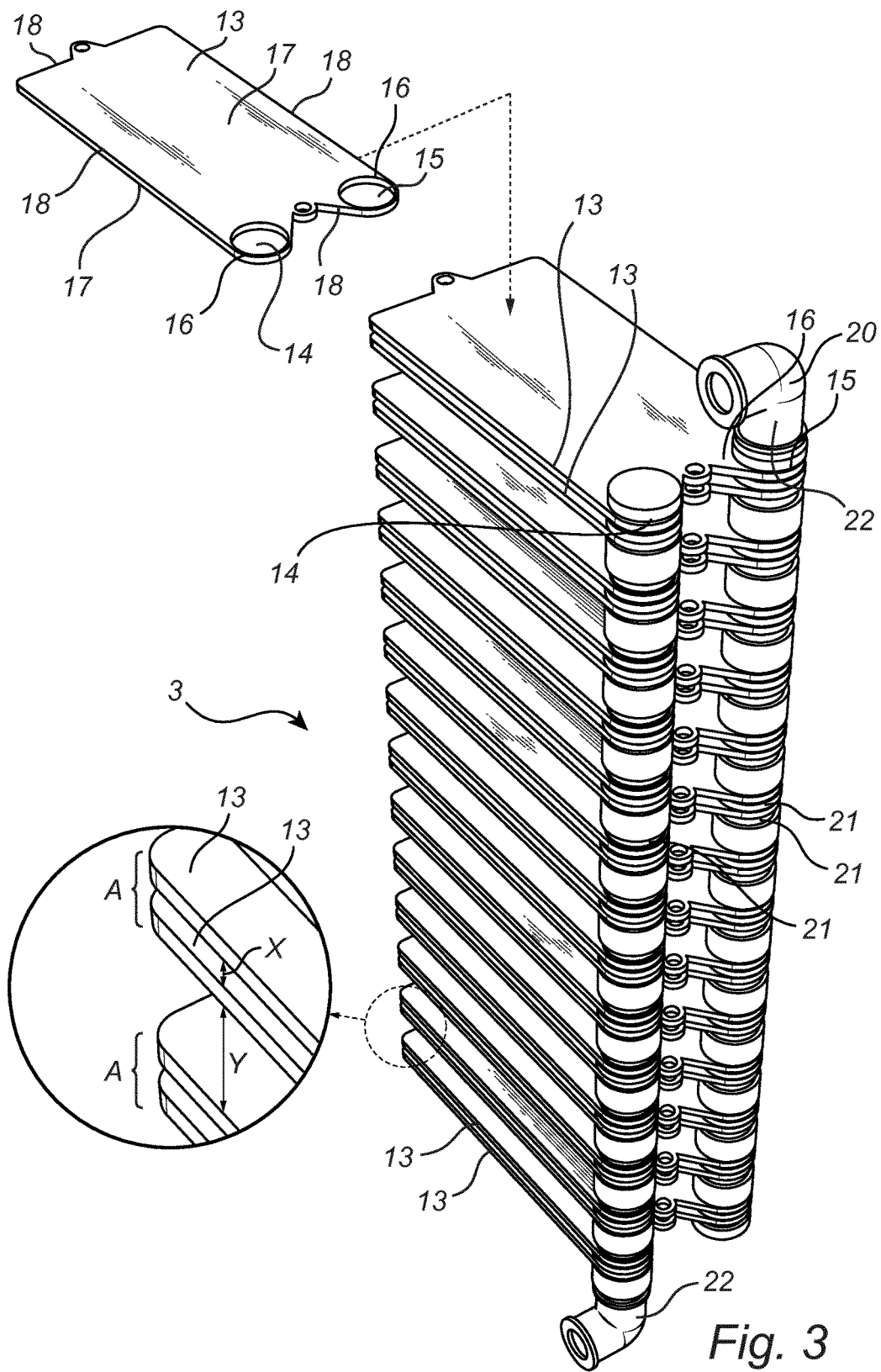
FIG. 3 discloses one embodiment of the second array of tubes.

Now turning to FIG. 3, the second array 3 of tubes 13 will be discussed. The second array 3 comprises a plurality of tubes 13 which are arranged side by side in pairs A. The tubes 13 of each pair A are arranged with a first interspace X whereas adjacent pairs A are arranged with a second interspace Y. The first interspace X should be large enough to allow insertion of a fixation arrangement (not shown) to be discussed below. The second interspace Y should be large enough to, as will be discussed below, allow insertion of an individual tube (not shown) of the first array and at least one thermoelectric module (not shown). Preferably thermoelectric modules are arranged on opposite sides of the individual tube to be inserted therein.

Each tube 13 is constituted by two, essentially flat wall portions 17 which are joined along their circumferential edge portions 18 to thereby delimit the essentially flat tube 13 with a through channel (not shown) having an inlet opening 14 and an outlet opening 15. In the disclosed embodiment the inlet openings 14 and outlet openings 15 are arranged next to each other along one and the same edge portion. Also, in the disclosed embodiment, the inlet and outlet openings 14, 15 are arranged in lobe shaped areas 16 in two adjacent corner portions of each tube 13. It goes without saying that the position may be altered.

The tubes 13 may be provided with internal turbulators (not shown).

The tubes 13 with their wall portions 17 and turbulators, if any, may be joined to form one integral unit by way of e.g. brazing, welding or bonding.

The inlets and outlets 14, 15 of the tubes 13 of the second array 3 are arranged in communication with a second inlet manifold 19 and a second outlet manifold 20 respectively. The second inlet and outlet manifolds 19, 20 are each in the disclosed embodiment constituted by a longitudinal sectionalized piping 22. Sealings 21 are preferably arranged in the interfaces between the sections of the piping 22 and the inlet and outlet openings 14, 15 respectively to prevent leakage.

In the disclosed embodiment the tubes 13 of the second array 3 are intended to be connected to the circulating flow of a cold fluid, such as a coolant used in a cooling system. The second array 3 is during use connected to the cooling system via the second inlet and outlet manifolds 19, 20 whereby the cold fluid will flow across the internal surfaces of each tube 13 from the inlet opening 14 thereof to the outlet opening 15 thereof.

Figure 4A:
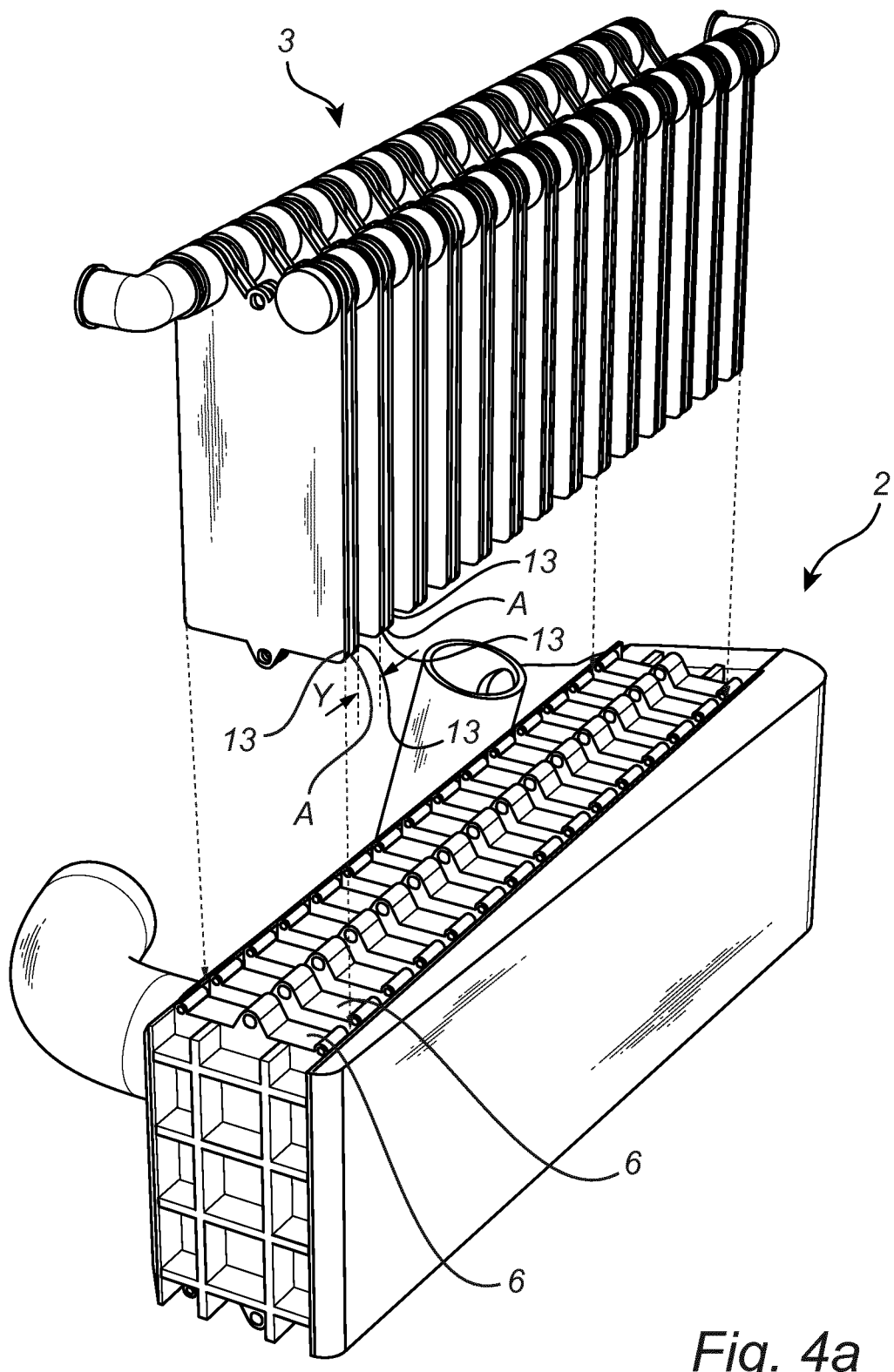
FIGS. 4a and 4b schematically disclose the assembling of the parts making up the energy recovering assembly.

Now turning to FIG. 4a, the tubes 6 of the first array 2 are arranged to be interdigitated with the tubes 13 of the second array 3. This may be made by two tubes 13 from the second array 3 forming a pair A being arranged between two successive tubes 6 of the first array 2. Accordingly, a tube 6 of the first array 2 is adapted to be received in the second interspace Y formed between two adjacent pairs A of tubes 13 of the second array 3.

Figure 4B:
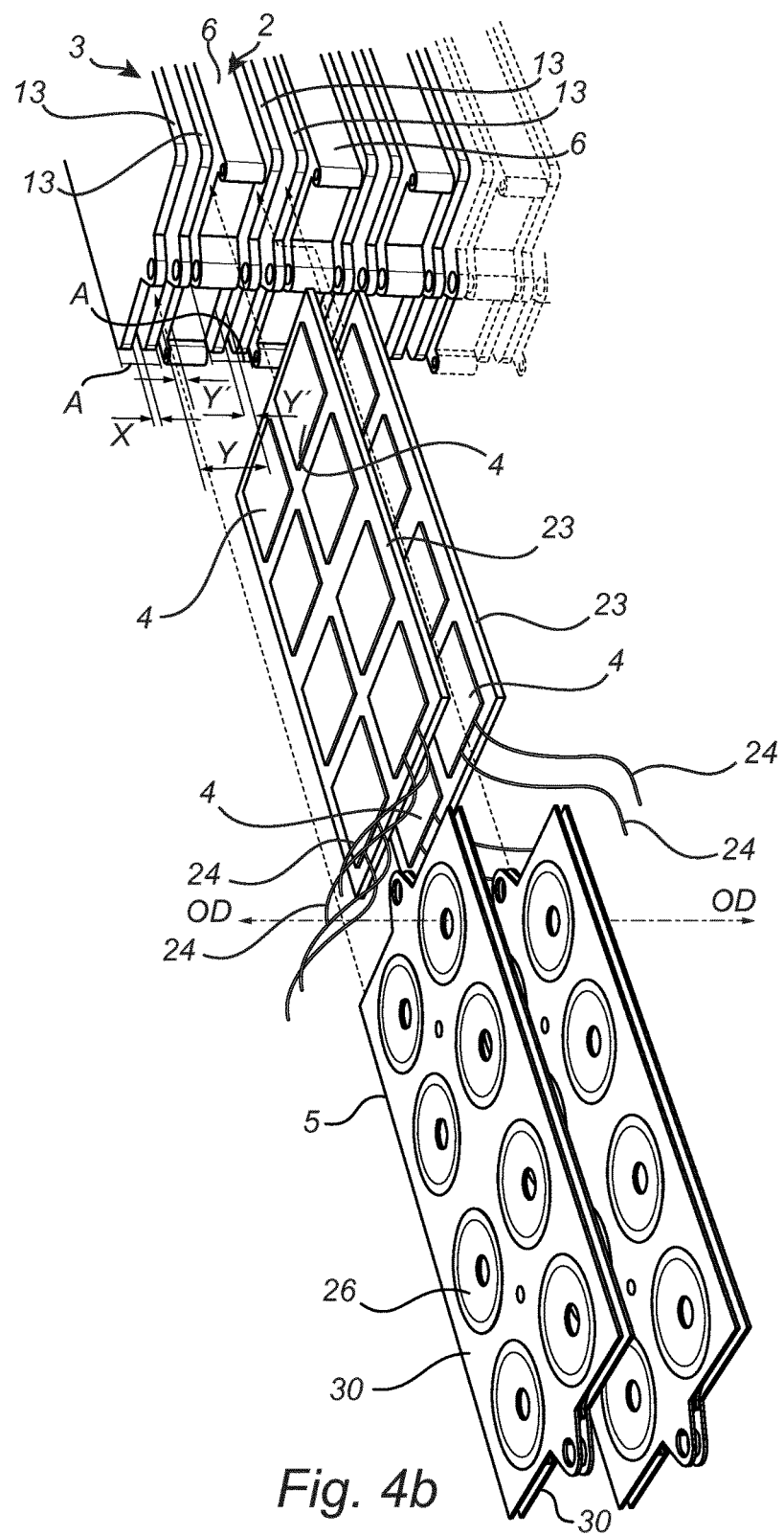

As seen in FIG. 4b, a sub-interspace Y' will be formed by the interdigitation between opposite walls of a tube 6 of the first array 2 and an adjacent tube 13 of the second array 3'. More precisely a sub-interspaces Y' will be formed on each side of a tube 6 of the first array 2.

The sub-interspaces Y' are used to receive thermoelectric modules 4. One and the same sub-interspace Y' may receive a plurality of thermoelectric modules 4 (TEM).

A thermoelectric module 4 as such is well known in the art and is a semiconductor-based electronic component that generates power by utilizing a temperature gradient and heat flow in order to produce useful power output. By integrating this kind of thermoelectric modules in an energy recovering assembly, waste or by-product heat flow generated by some other activity may be used to generate power.

It is to be understood that the thermoelectric modules 4 may be arranged in a number of ways. By way of example the thermoelectric modules 4 may be attached in advance on the essentially flat wall portions of either of the tubes 6, 13. This may by way of example be made by bonding. It is also possible to provide, as disclosed, a plurality of thermoelectric modules 4 pre-mounted in a frame 23 or on a sheet which may be handled as one integral unit during assembly. In such frame 23 or sheet, a plurality of thermoelectric modules 4 may be arranged in a predetermined pattern with their wires 24 well organized and providing easy access from the exterior of the energy recovering assembly. It goes without saying that no matter how the thermoelectric modules 4 are provided, access to their individual wires 24 should be provided for from the exterior of the interdigitated tubes 6, 13. Also, if mounted in a frame or on a sheet, the individual thermoelectric modules 4 should be received in through holes allowing an intimate contact surface with the tubes 6, 13 when received in the sub-interspaces Y'.

The energy recovering assembly 1 further comprises fixation arrangements 5. The fixation arrangements 5 are adapted to be inserted into and thereby received in the interspaces X between two tubes 13 of the second array 3 making up a pair A.

Figure 5A:
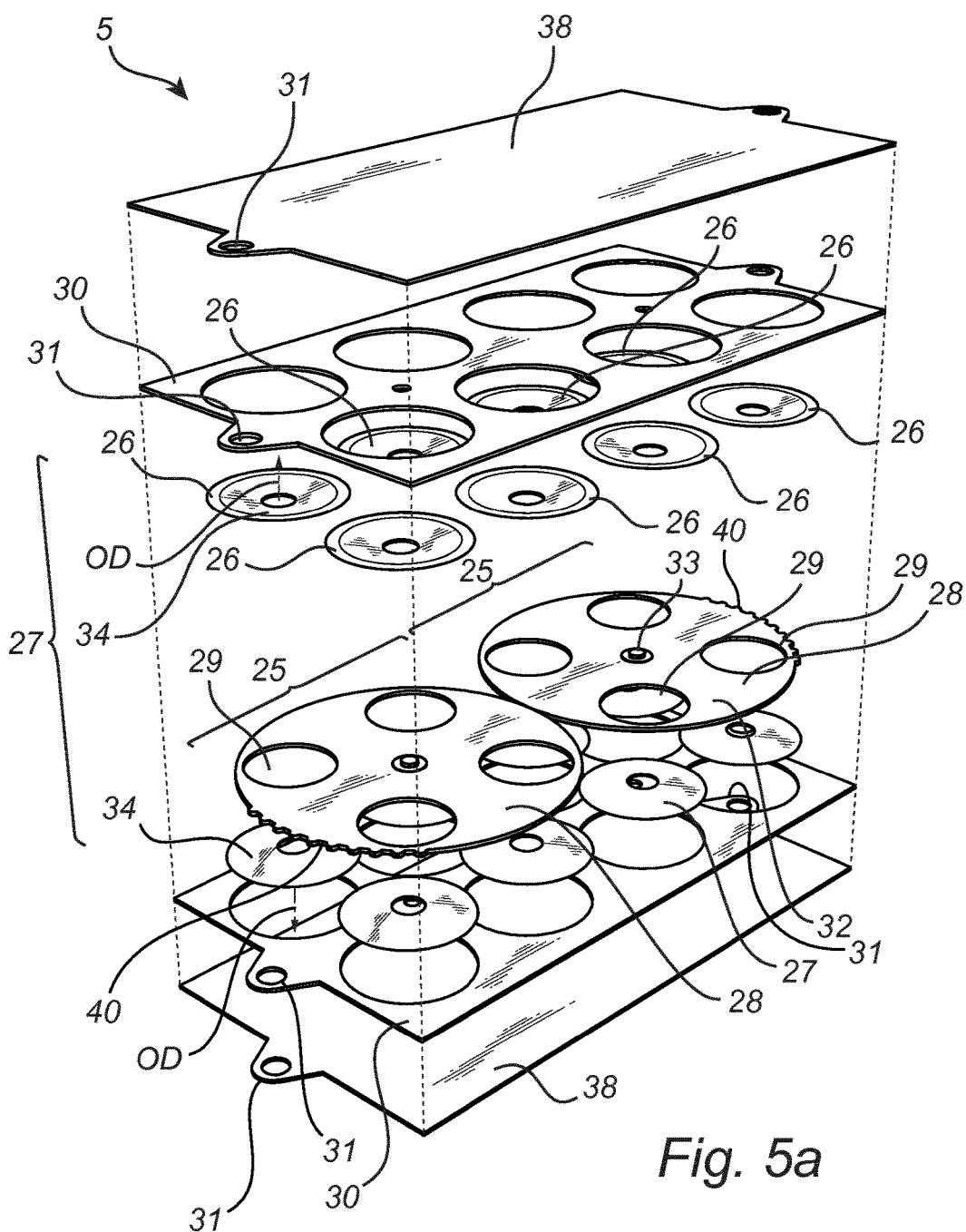

Now turning to FIG. 5a, one embodiment of such fixation arrangement 5 is disclosed as an exploded view. The fixation arrangement 5 comprises two groups 25 of pressure means 26. Each group 25 comprises four pairs 27 of pressure means 26 in the form of disc springs or cup springs. The pressure means 26 in each pair 27 are arranged linearly opposite each other to thereby operate in opposite directions during use. The pressure means 26 are preferably arranged with their operation directions OD linearly coinciding with a center point of an individual thermoelectric module (not disclosed).

The pairs 27 of pressure means 26 in each group 25 are separated by a spacer 28. The spacer 28 is constituted by a plate extending in a plane perpendicular to the operation directions OD of the pressure means 26. The spacer 28 is provided with through holes 29 partly receiving the pressure means 26 of each pair 27 and more precisely the opposite ends 34 thereof facing each other.

The spacer 28 and the pressure means 26 are arranged between two opposing frames 30 keeping the pressure means 26 in position. Further, the frames 30 are arranged between two opposing wall portions 38.

The opposing wall portions 38 may be omitted whereby the frames 30 will act as outer most wall portions of the fixation arrangement 5.

The frames 30 and the wall portions 38 (if any) are mutually joined at two opposite edge portions 31 to allow the fixation arrangement 5 to be handled as one integral unit. The joining (not disclosed) is preferably flexible, thereby allowing the opposite wall portions 38 to mutually move in a direction coinciding with the operation direction OD of the pressure means 26.

In the disclosed embodiment, the spacer 28 is formed as a circular disc 32 that is rotatable around a central axis 33. The spacer 28 is operable by turning between two states. State one is disclosed in FIGS. 5b and 5c, whereas state 2 is disclosed in FIGS. 5d and 5e.

In the first state, see FIGS. 5b and 5c, the opposite ends 34 of the pressure means 26 making up a pair 27 are received in hole 29 of the spacer 28 with their ends 34 facing each other. The two ends 34 may even be in contact with each other.

To set the fixation arrangement 5 to the second state, the spacers 28 are rotated around the central axis 33. During the rotation of the spacer 28, the wall portions 36 of the holes 29 of the spacer 28 will climb by a wedging action along the cup or disc shaped exterior wall portions 37 of the pressure means 26. The climbing and wedging action may further be facilitated by providing the wall portion 36 of the holes of the spacer 28 with a chamfering (not disclosed). To ensure that the fixation arrangement will remain in the second state position the spacer 28 may be provided with a locking mechanism (not disclosed). By way of example such locking mechanism may comprises a dimple or imprint in the wall 35 of the spacer which will engage the center hole of the disc spring. By such locking mechanism it may be safeguarded that the fixation arrangement will not go back to the first state because of vibrations or movements which may occur during vehicle operation.

In the second state, see FIGS. 5d and 5e, the spacer 28 has been rotated to such extent around the central axis 33 that the wall 35 of the spacer 28 is forced to a position between the opposite ends 34 of the pressure means 26, thereby compressing each of the two pressure means 26 to a degree corresponding half the thickness of the wall 35 of the spacer 28. The compression will result in a reaction force F, coinciding with the operation direction OD of the pressure means 26, which reaction force F acts on the two exterior wall portions 38 of the fixation arrangement 5. The reaction force F will strive to separate the two wall portions 38.

In the disclosed embodiment, the spacers 28 are provided with gears 40 allowing interaction with an external drive mechanism (not disclosed) to thereby set the fixation arrangement 5 between the first and the second state. It goes without saying that the other setting means are feasible.

Now turning to FIG. 4b, during assembly of the energy recovering assembly 1, the fixation arrangement 5 is set to its first state and is inserted in the interspace X between two tubes 13 of the second array 3. Then, the fixation arrangement 5 is set to its second state whereby the outer most walls 30 of the fixation arrangement 5 will be separated by the pressure means 26. In FIG. 4b, the outer most walls of the fixation arrangement 5 are formed by the frames 30. As a consequence the two tubes 13 of the second array 3 adjacent the wall portions 30 of the fixation arrangement 5 will be forced towards the thermoelectric modules 4 and towards the successive tube 6 of the first array adjacent thereto. Thereby, an intimate contact between the thermoelectric modules 4 and the adjacent tubes 6, 13 from the first and second arrays 2, 3 will be established.

By the assembly comprising a uniform distribution of such fixation arrangements 5, the thermoelectric modules 4 arranged in the assembly 1 will be subjected to an evenly distributed pressure distribution and contact surface. The even pressure distribution and contact surface is enhanced by the pressure means 26 preferably being arranged with their operation directions OD linearly coinciding with a center point of an individual thermoelectric module 4.

The fixation arrangement may be arranged in a number of ways with remained function. By way of example, the spacer 28 may be arranged to be pushed of pulled instead of being rotated.

Figure 6A:
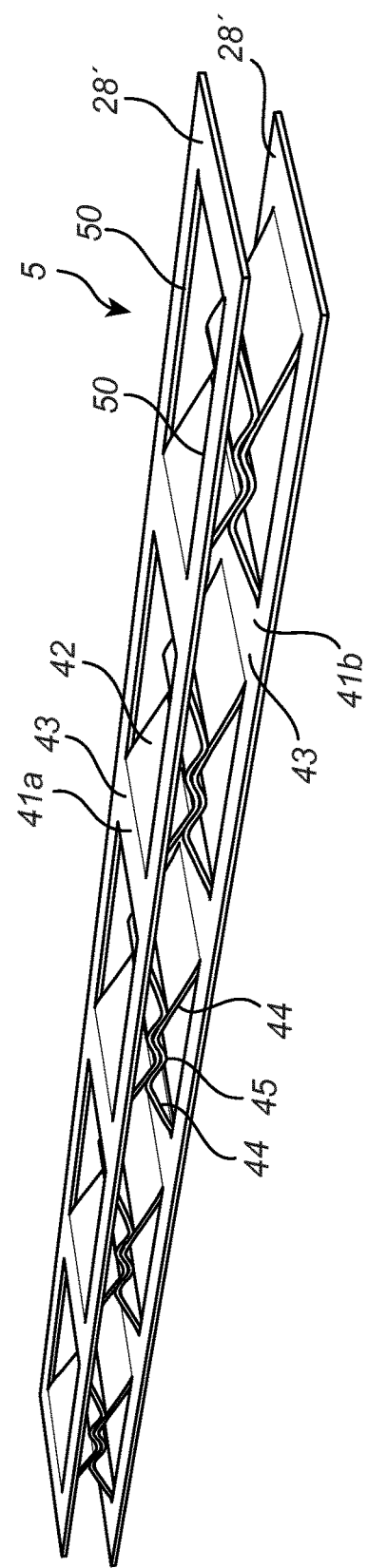

A first example of an embodiment where the fixation arrangement 5 is operated by pushing or pulling is disclosed in FIGS. 6a-6c. The fixation arrangement 5 comprises spacers 28' in the form of two mirrored sheets 41a, 41b facing each other. Each sheet 41a, 41b comprises a pressed wave shaped pattern in the shape of an M-profile 42 with intermediate essentially flat portions 43. The M-profile 42 comprises two legs 44 surrounding a V-shaped waist 45. To increase flexibility, each M-profile 42 is provided with two longitudinal slits 50 forming opposite boundary lines along the M-profile 42. It is to be understood that other patterns than an M-shape are possible with remained function.

Now turning to FIG. 6b, the fixation arrangement is schematically disclosed as arranged in an interspace X between two tubes 13 of the second array 3. By being mutually displaced by pushing or pulling, see arrows, in a direction in parallel with the major surface extension of the two mirrored sheets 41a, 41b, the fixation arrangement 5 may be set between a first and a second state. In the first state, see FIG. 6b, the two sheets 41a, 41b are displaced to such extent that the M-profile 42 of the first sheet 41a is arranged adjacent the M-profile 42 of the second sheet 41b whereby a first distance "a" between the essentially flat portions 43 of the two sheets 41a, 41b is formed. The distance "a" may in principle correspond to the distance X formed between two adjacent tubes 13.

In the second state, see FIG. 6c, the two sheets 41a, 41b have been mutually displaced to such extent that the legs 44 of the two opposite M-profiles 42 have slid against each other to a position in which the waists 45 of two opposite M-profiles 42 are engaging each other. The displacement can be seen as a climbing or wedging interaction between the two sheets 41a, 41b. In this second state, a second distance "a'" is formed between the essentially flat portions 43 of the two sheets 41a, 41b, the second distance "a'" being larger than the first distance "a".

Accordingly, in the first state, see FIG. 6b, the fixation arrangement 5 is insertable in an associated interspace X between two tubes 13, whereas in the second state, see FIG. 6c, the distance a' between the two sheets 41a, 41b has increased thereby exerting a pressure on the two tubes 13, forcing each of them towards the thermo electric modules 4 and towards the successive tubes 6 adjacent the thermoelectric modules 4. In the disclosed embodiment, highly schematic dollies 100 are shown adjacent the tubes 6.

Figure 7A:
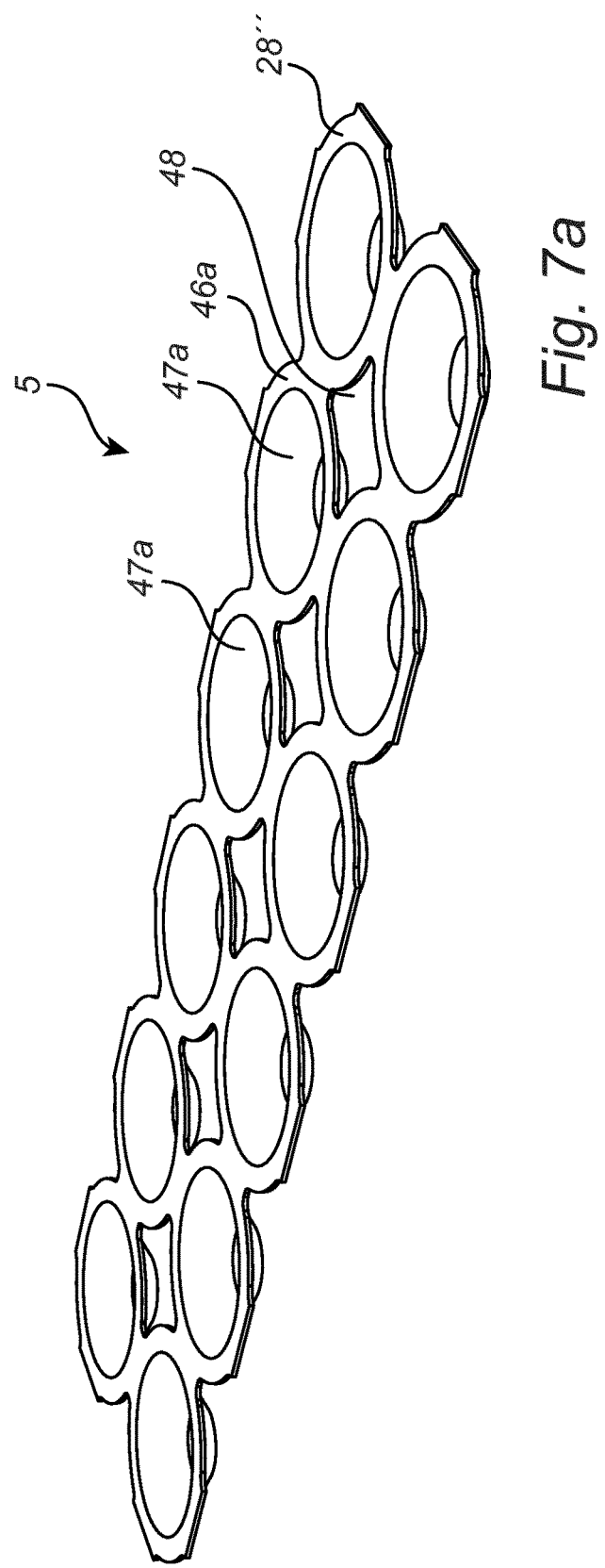
Figure 7C:
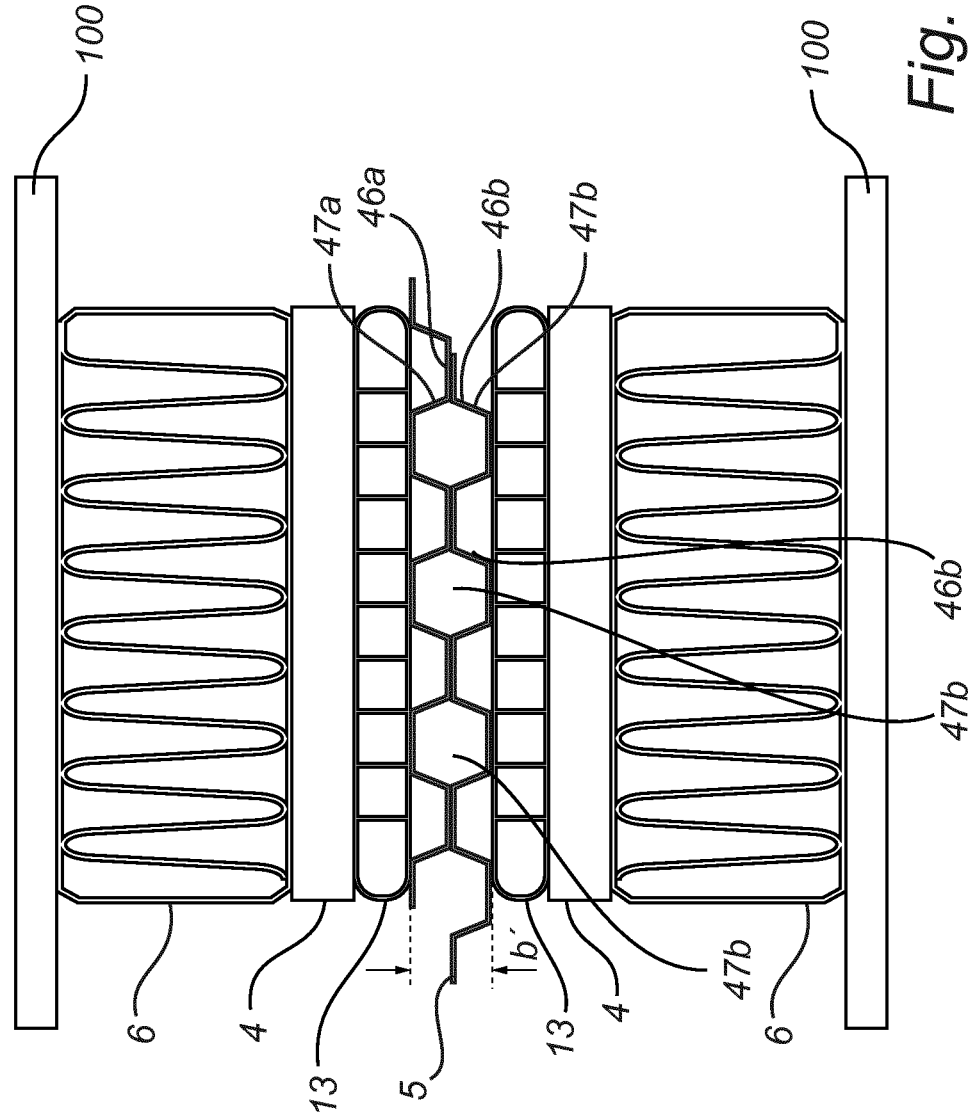

In yet another embodiment, see FIGS. 7a-7c, the fixation arrangement 5 comprises a spacer 28" in the form of two mirrored sheets 46a, 46b facing each other. To facilitate illustration, only one is disclosed in FIG. 7a. Each sheet 46a, 46b comprises a pressed cup-shaped shaped pattern in which a plurality of cups 47a, 47b are arranged in an orthogonal pattern. To improve the flexibility surplus material 48 between the cups may be removed.

The sheets 46a, 46b are arranged one on top of the other with the cups 47a, 47b forming convex extensions facing each other.

By being mutually displaced by pushing or pulling in a direction in parallel with the major surface extension of the two mirrored sheets 46a, 46b, the fixation arrangement 5 may be set between a first and a second state.

In the first state, see FIG. 7b, the two sheets 46a, 46b are displaced to such extent that the convex cups 47a of the first sheet 46a are received between successive convex cups 47b of the second sheet 46b, whereby a first distance "b" between the two sheets 46a, 46b is formed.

In the second state, see FIG. 7c, the two sheets 46a, 46b have been mutually displaced to such extent that the exterior surfaces of the cups 47a, 47b of the first and the second sheets 46a, 46b have slid by a climbing action against each other to a position in which the cups 47a of the first sheet 46a are arranged on top of the cups 47b of the second sheet 46b. In this second state, a second distance "b'" is formed between the two sheets 46a, 46b, the second distance "b'" being larger than the first distance "b". Accordingly, in the first state the fixation arrangement 5 is insertable in an associated interspace X between two tubes 13, whereas in the second state, the distance b' between the two sheets 46a, 46b has increased thereby exerting a pressure on the two tubes 13 forcing each of the two tubes 13 towards the thermo electric modules 4 and towards the successive tubes 6 adjacent the thermoelectric modules. In the disclosed embodiment, highly schematic dollies 100 are shown adjacent the tubes 6.

By the two latter embodiments of the fixation arrangement, no separate spring means 26 are required since the M-profiles 42 and cup-shaped profiles 47 as such may act as spring means.

Figure 8:
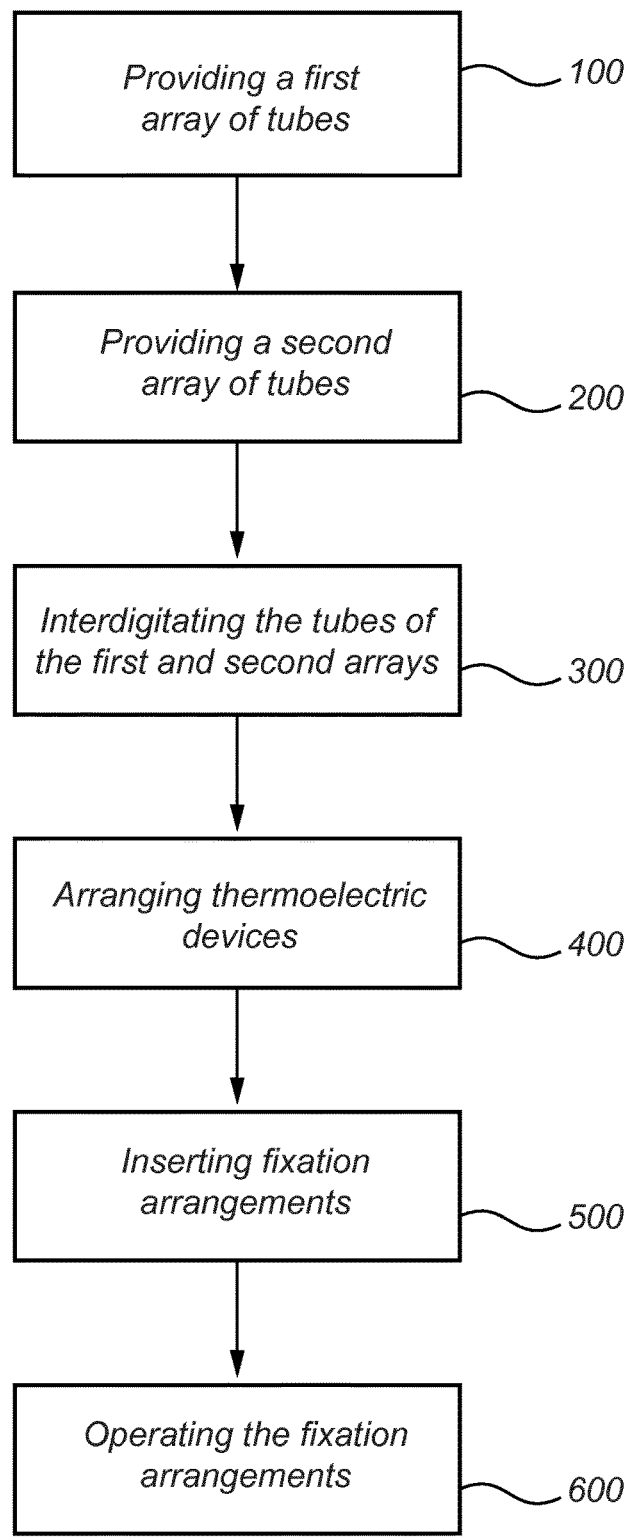
FIG. 8 discloses the steps of the method of providing the energy recovering assembly.

Now referring to FIG. 8, the invention relates to a method of providing an energy recovering assembly. The method comprises the following steps:

Providing 100 a first array of tubes, each adapted to receive a flow of hot fluid between a first inlet manifold and a first outlet manifold, the first array of tubes being provided as an integral brazed unit.

Providing 200 a second array of tubes, each adapted to receive a flow of a cold fluid between a second inlet manifold and a second outlet manifold, the second array of tubes being provided as an integral brazed unit.

Interdigitating 300 the tubes of the first array with the tubes of the second array, such that two tubes from the second array are arranged between two successive tubes of the first array, or such that two tubes from the second array are arranged between two successive tubes of the first array.

Arranging 400 thermo electric modules in gaps between adjacent tubes of the first and second arrays.

Inserting 500 a fixation arrangement in an interspace between said two tubes from the second array being arranged between two successive tubes of the first array, or in an interspace between said two tubes from the first array being arranged between two successive tubes of the second array.

Operating 600 the fixation arrangement to a second state in which the fixation arrangement exerts a pressure on the two tubes in the associated interspace, forcing each of the two tubes towards the thermo electric modules and towards the successive tubes adjacent the thermoelectric modules, thereby providing a contact between the thermo electric modules and the adjacent tubes of the first and second arrays.

The description given below has exemplified a number of embodiments. No matter embodiment, the number of pressure means and the number of thermoelectric modules may alter. It is preferred that the number of pressure means correspond to the number of thermoelectric modules and that the operation direction of the pressure means is essentially co-linear with centre point of the thermoelectric modules.

No matter if the spacer is rotated, pushed or pulled it is preferred that the edge portions of the through holes receiving the pressure means are guided along the outer wall portions provided by the cup spring means. To reduce the friction, the circumferential edge portion of the through holes may be chamfered.

It goes without saying that in the outermost portions of a heat recovering assembly it is sufficient to use a single layer of pressure means instead of using pairs of pressure means.

In one, not disclosed embodiment, the fixation arrangement may be provided without any opposite side walls, whereby the pressure means will act directly against a tube of either the first or second array depending on where in the assembly the fixation arrangement is used.

Further, it is to be understood that the spacer, in case of being designed to be pushed or pulled, may be pushed or pulled to such extent that it is completely removed from the assembly. In such embodiment, the fixation arrangement, when set to the second state will be constituted by the pressure means and the opposite side walls, if any.

In case of circular spacers operable by rotation, it is possible to provide the spacers with followers (not disclosed) along their perimeters. During rotation of one of the spacers, the follower of the rotated spacer will interact with the follower of the other spacer, thereby rotating the latter to the same extent and accordingly thereby also setting the pressure means operable by that individual spacer. Accordingly, by followers it is sufficient to operate only one of the spacers to set all pressure means of a fixation arrangement.

The tubes of the first and second arrays have been exemplified with the fixation arrangement being received in an interspace between two adjacent tubes adapted to receive a cold fluid. The invention should not be limited to this embodiment. Thus, the fixation arrangement may be received in an interspace between two adjacent tubes adapted to receive a hot fluid.

It is appreciated that the embodiments of the invention as disclosed above may be altered in different ways within the scope of the appended claims.

The invention claimed is:

1. An energy recovering assembly for extraction of electric power, comprising:
a first array of tubes each adapted to receive a flow of a hot fluid between a first inlet manifold and a first outlet manifold; and
a second array of tubes, each adapted to receive a flow of a cold fluid between a second inlet manifold and a second outlet manifold;
wherein the tubes of the first array are interdigitated with the tubes of the second array, such that two tubes of the second array are arranged between two successive tubes of the first array or such that two tubes of the first array are arranged between two successive tubes of the second array, and wherein each of the tubes of the first array and the second array have a flat cross section delimited by at least two opposing wall portions, and wherein the energy recovering assembly further comprises:
thermoelectric modules in sub-interspaces between adjacent interdigitated tubes of the first and second arrays; and
fixation arrangements in interspaces between said two tubes of the second array being arranged between the two successive tubes of the first array, or in the interspaces between said two tubes of the first array being arranged between two successive tubes of the second array, each of the fixation arrangements comprising at least one pressure means and a spacer, wherein the at least one pressure means is a disc spring or a cup spring, and wherein the spacer is movable in a plane parallel to surfaces of two opposing wall portions of the two tubes of the second array arranged between the two successive tubes of the first array or the two tubes of the first array arranged between the two successive tubes of the second array to a position over or under the at least one pressure means, whereby each of the fixation arrangements is operable between:
a first state allowing the fixation arrangement to be inserted in an associated interspace; and
a second state in which the fixation arrangement is adapted to exert a pressure on the two tubes forming the associated interspace in a direction perpendicular to the surfaces of the two opposing wall portions, forcing said two tubes of the second array arranged between the successive tubes of the first array or said two tubes of the first array arranged between the successive tubes of the second array towards respective thermoelectric modules and towards the successive tubes adjacent to the respective thermoelectric modules, providing a contact between the thermoelectric modules and the adjacent interdigitated tubes of the first and second arrays.

2. The energy recovering assembly according to claim 1, wherein the at least one pressure means in the first state is partly received in a through hole in the spacer.

3. The energy recovering assembly according to claim 2, wherein the spacer is arranged between two opposing pressure means, and wherein the two opposing pressure means are partly received in the through hole of the spacer.

4. The energy recovering assembly according to claim 1, wherein the spacer is operated by being rotated to the position over or under the at least one pressure means.

5. The energy recovering assembly according to claim 1, wherein the spacer and the at least one pressure means are arranged between the surfaces of the two opposing wall portions, whereby each of the fixation arrangements is one integral unit.

6. The energy recovering assembly according to claim 1, wherein the fixation arrangements are arranged to remain in the second state by a locking mechanism unless actively being set to aid the first state.

7. A method of providing an energy recovering assembly, the method comprising:
providing a first array of tubes, each adapted to receive a flow of hot fluid between a first inlet manifold and a first outlet manifold, the first array of tubes being provided as a first integral brazed unit,
providing a second array of tubes, each adapted to receive a flow of a cold fluid between a second inlet manifold and a second outlet manifold, the second array of tubes being provided as a second integral brazed unit,
interdigitating the tubes of the first array with the tubes of the second array, such that two tubes of the second array are arranged between two successive tubes of the first array or such that two tubes of the second array are arranged between two successive tubes of the first array, wherein each of the tubes of the first array and the second array have a flat cross section delimited by at least two opposing wall portions,
arranging thermoelectric modules in sub-interspaces between adjacent interdigitated tubes of the first and second arrays, and
inserting a fixation arrangement in a first interspace between said two tubes of the second array being arranged between two successive tubes of the first array or in a second interspace between said two tubes of the first array being arranged between two successive tubes of the second array, the fixation arrangement comprising at least one pressure means and a spacer, wherein the at least one pressure means is a disc spring or a cup spring, and wherein the spacer is movable in a plane parallel to surfaces of two opposing wall portions of the two tubes of the second array arranged between the two successive tubes of the first array or the two tubes of the first array arranged between the two successive tubes of the second array to a position over or under the at least one pressure means, and
operating the fixation arrangement from a first state allowing the fixation arrangement to be inserted into the first interspace or the second interspace to a second state in which the fixation arrangement exerts a pressure on the two tubes forming the first interspace or the second interspace in a direction perpendicular to the surfaces of the two opposing wall portions, forcing said two tubes of the second array arranged between the successive tubes of the first array or the two tubes of the first array arranged between the successive tubes of the second array towards respective thermoelectric modules and towards the successive tubes adjacent the respective thermoelectric modules, thereby providing a contact between the thermoelectric modules and the adjacent interdigitated tubes of the first and second arrays.

8. An energy recovering assembly for extraction of electric power in a combustion engine the energy recovering assembly comprising:
a first array of tubes each adapted to receive a flow of exhaust gases from the combustion engine between a first inlet manifold and a first outlet manifold; and
a second array of tubes, each adapted to receive a flow of a coolant between a second inlet manifold and a second outlet manifold,
wherein the tubes of the first array are interdigitated with the tubes of the second array, such that two tubes of the second array are arranged between two successive tubes of the first array or such that two tubes of the first array are arranged between two successive tubes of the second array, wherein each of the tubes of the first array and the second array have a flat cross section delimited by at least two opposing wall portions, and wherein the energy recovering assembly further comprises
thermoelectric modules in sub-interspaces between adjacent interdigitated tubes of the first and second arrays, and
fixation arrangements in interspaces between said two tubes of the second array being arranged between the two successive tubes of the first array, or in the interspaces between said two tubes of the first array being arranged between two successive tubes of the second array, each of the fixation arrangements comprising at least one pressure means and a spacer, wherein the at least one pressure means is a disc spring or a cup spring, and wherein the spacer is movable in a plane parallel to surfaces of two opposing wall portions of the two tubes of the second array arranged between the two successive tubes of the first array or the two tubes of the first array arranged between the two successive tubes of the second array to a position over or under the at least one pressure means, whereby each of the fixation arrangements is operable between:
a first state allowing the fixation arrangement to be inserted in an associated interspace; and
a second state in which the fixation arrangement is adapted to exert a pressure on the two tubes forming the associated interspace in a direction perpendicular to the surfaces of the two opposing wall portions, forcing said two tubes of the second array arranged between the successive tubes of the first array or said two tubes of the first array arranged between the successive tubes of the second array towards respective thermoelectric modules and towards the successive tubes adjacent the respective thermoelectric modules, providing a contact between the thermoelectric modules and the adjacent interdigitated tubes of the first and second arrays.

* * * * *